United States Patent [19]

Williams et al.

[11] Patent Number: 5,425,139
[45] Date of Patent: * Jun. 13, 1995

[54] METHODS FOR INTELLIGENT MOVEMENT OF OBJECTS ON COMPUTER DISPLAYS

[75] Inventors: Kenneth A. Williams, Bass Lake; David C. Iden; Larry L. Scott, both of Oakhurst, all of Calif.

[73] Assignee: Sierra On-Line, Inc., Oakhurst, Calif.

[*] Notice: The portion of the term of this patent subsequent to Feb. 15, 2011 has been disclaimed.

[21] Appl. No.: 152,309

[22] Filed: Nov. 12, 1993

Related U.S. Application Data

[63] Continuation of Ser. No. 598,174, Oct. 15, 1990, Pat. No. 5,287,446.

[51] Int. Cl.$^6$ ............................................. G06T 13/00
[52] U.S. Cl. ................................................. 395/152
[58] Field of Search ........................ 395/152, 142, 143

[56] References Cited

U.S. PATENT DOCUMENTS

| | | | |
|---|---|---|---|
| 4,053,740 | 10/1977 | Rosenthal | 364/410 |
| 4,089,524 | 5/1978 | Hauck | 273/85 G |
| 4,357,014 | 11/1982 | Baer et al. | 273/85 G |
| 4,862,373 | 8/1989 | Meng | 395/90 X |
| 4,905,147 | 2/1990 | Logg | 273/85 G X |
| 4,905,168 | 2/1990 | McCarthy et al. | 395/152 X |
| 5,047,916 | 9/1991 | Kondo | 395/90 X |
| 5,058,024 | 10/1991 | Inselberg | 364/461 |

OTHER PUBLICATIONS

"Creating Arcade Games on the Commodore 64", 1984, Compute! Publications, Inc., Chapter 9, pp. 235–253.
Wilhelms, "Toward Automatic Motion Control", IEEE Computer Graphics and Applications, Apr. 1987, pp. 11–22.

Primary Examiner—Mark K. Zimmerman
Attorney, Agent, or Firm—Fenwick & West; Albert C. Smith

[57] ABSTRACT

A method and system for controlling the movement of an object between points on a display along natural or "intelligent" paths around obstacles includes establishing a locus of data points around each obstacle along which displayed movement of the object may proceed under conditions of the direct trajectory between points intersecting the locus of data points. "Freeway" paths are provided between remote sectors of the display to expedite "natural" movements over substantial distances around obstacles in a second embodiment.

18 Claims, 15 Drawing Sheets

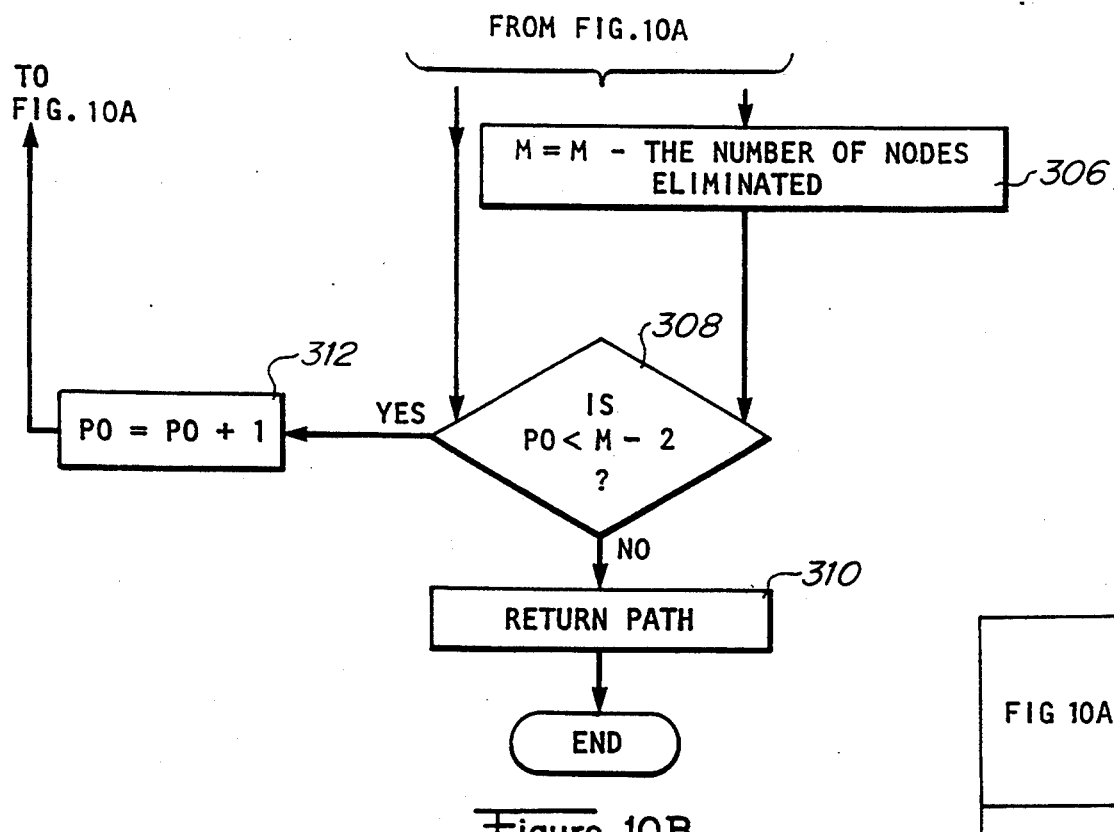
Figure 10B
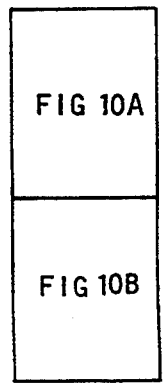
Figure 10
LIST OF POINTS
150, 150
150, 140
150, 120 ← INTERCEPT
140, 100
130, 90
100, 90 ← INTERCEPT
50, 150
50, 180
Figure 2

Figure 8 (MAP)

METHODS FOR INTELLIGENT MOVEMENT OF OBJECTS ON COMPUTER DISPLAYS

The present application is a continuation of copending application Ser. No. 07/598,174 filed Oct. 15 1990, U.S. Pat. No. 5,287,446, "System and methods for intelligent Movement on Computer Displays".

BACKGROUND OF THE INVENTION

1. Field of the Invention

This invention relates to computer-controlled displays of pixel information, and more particularly to a system and method for controlling the display of a movable image within a displayed field to provide intelligent and life-like transitions of the displayed image as it is moved from one position to another position in the displayed field.

2. Description of Related Art

Conventional video game systems commonly rely upon program information and operator controls to form displayable images of a movable person, vehicle, or the like, within a relatively static background field of objects such as trees, roads, rocks, walls, and the like. Such video game systems typically incorporate "joystick" controllers or cursor-control buttons for producing operator control signals that determine the position or direction of movement of the movable object within the background field. In such systems of contemporary design, the movable object as displayed is usually inhibited from moving through an impassable object or area such as a displayed wall, tree or rock, and the system operator is then required to manipulate cursor-control buttons or joystick controller to maneuver the displayed movable object around the displayed impassable objects. In this manner, a system operator maintains control over a movable object as it is continually repositioned and redirected along a desired path among impassable objects within the computer-controlled display. If the movable object is maneuvered into an impassable object such as a rock or tree, then the movable object may not be advanced further in a direction through the impassable object, but will have to be controlled or maneuvered by the system operator in other directions away from the impassable object under computer control. Systems of this type are commercially available and commonly include a console unit to which manual controllers are connected, and to which various memory cartridges can be connected that configure the video game system for operation as a labyrinth game, race, sporting event, or the like.

However, in certain computer-controlled game systems, a conventional "mouse"-type controller may be utilized to position a displayed cursor at a selected position in a conventional manner. It also may be that the system operator wants the object he is controlling to keep moving in some general direction without having to maneuver the object around the impassable object that normally prevents the movable object from continuing on the desired direction. (i.e., A direction key is used to designate travel in an easterly direction and there happens to be an impassable object east of the movable object). When such a controller is arranged to designate a destination for a displayed movable object within a displayed field of impassable objects, a direct path, or trajectory, between where a movable object is positioned in the display and where the operator desires the movable object to be next positioned in the display may intercept an impassable object that inhibits further movement of the movable object toward the desired position without additional maneuvering by the system operator. With a mouse-type controller, such maneuvering may involve awkward repositioning of a displayed cursor, via the "mouse" to overlap the position where the movable object is "stuck" against an impassable object, and thereafter redefine different path segments to maneuver the movable object around the impassable object toward the desired next position. This severely limits the speed with which a computer-controlled game sequence may progress through a sequence of scenes or events, and contributes to operator frustration in having to maintain continuous control over the movable object during even the most trivial repositioning maneuvers associated with a displayed scene or event.

SUMMARY OF THE INVENTION

In accordance with the embodiments of the present invention, the path or trajectory for movement of a displayable object from one position to another position may be manually controlled by selecting the destination position using a mouse-type controller or by selecting a specific direction of travel using a direction key or joystick, and by determining whether the trajectory intercepts an impassable object or an area to be avoided in the display. In the first embodiment of the present invention, each such displayed impassable object or area has an avoidance path associated therewith which comprises a locus of points or nodes that are spaced around the impassable object or area. The trajectory to a desired next position or destination of the movable object is thus compared with avoidance paths associated with one or more impassable objects or areas positioned in the trajectory. As the movable object approaches an impassable object or area, the movable object is independently controlled to traverse along the avoidance path around the impassable object or area to a point or node along the avoidance path nearest the desired next position, at which point or node the movable object then leaves the avoidance path and proceeds toward the next desired position or destination.

The computational overhead of calculating each new trajectory for a movable object from its present displayed position to its desired destination position is reduced by incorporating a control or trigger profile around each displayed impassable object or area, and initiating independent control of a movable object along an avoidance path only in response to intersection of a movable object with the trigger profile around an impassable object or area. Avoidance paths are provided which surround certain impassable objects or areas to avoid such as trees, holes, ponds and rocks to facilitate controlling the displayed movement of a movable object along the shortest avoidance path around such impassable object or area. In this manner, a movable object may be displayed as exhibiting rudimentary "intelligence" in being able to maneuver independently around an impassable object in the path or trajectory of the movable object to its destination position without requiring the system operator to remain in continuous control of all movements of the movable object around an impassable object or area.

In a second embodiment of the present invention, a displayed field may be segregated into sectors over the area of the display, with avoidance paths associated with each impassable object or area and with "freeway"

paths oriented between spaced sectors to serve as preferred trajectories for a movable object to follow in traversing major distances in the displayed field. This preserves the realism of "intelligent" movements exhibited by a movable object in response to major changes in desired position within a displayed field while significantly speeding up progress of the game through insignificant sequences that should not require the operator's continuous attention or control over the movement of the movable object.

In a third embodiment of the invention, the impassable objects are defined by closed polygons that are not self intersecting. Each polygon is defined by a plurality of nodes. The polygons are compared to the trajectory between the beginning point and the selectable point. A path for movement of the object is established as the being along the direct trajectory except where a polygon is intersected. Where a polygon is intersected the path will be about the polygon. Once the path has been established, the path is optimized by eliminating unnecessary nodes by following new paths between any two nodes, even on different polygons, as long as the new path does not intersect any polygon.

BRIEF DESCRIPTION OF THE DRAWINGS

FIG. 2 illustrates a look-up table of the coordinates of points along an avoidance path;

FIGS. 6 and 6A–6C are a flow chart of the process for displaying movement of objects along "intelligent" routes;

FIGS. 8A, 8B, 8C, 8D and 8E are flow charts of the process for providing intelligent movement of a movable object in accordance with a third embodiment of the present invention;

FIGS. 10 and 10A, are a flow chart of the process of third embodiment for optimizing a path between two points.

DESCRIPTION OF THE PREFERRED EMBODIMENTS

Figure 1:
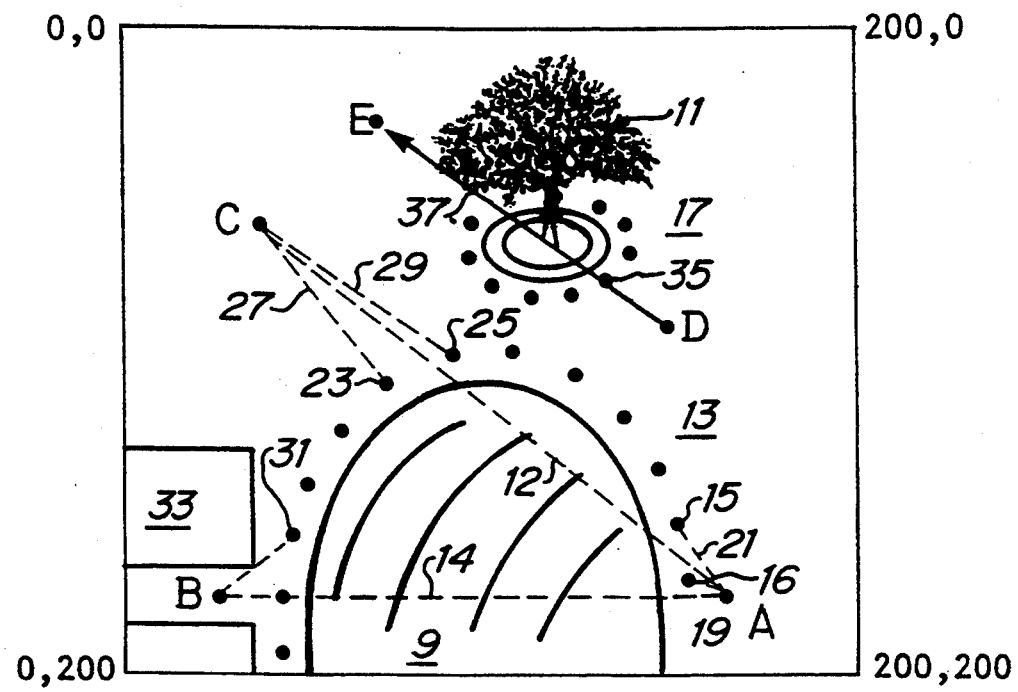
FIG. 1 is a pictorial representation of a computer-controlled raster-type display of a background scene in a video game.

Referring now to FIG. 1, there is shown a pictorial representation of a computer-controlled display in which background objects such as a rock 9 and a tree 11 are displayed on a raster-type display in conventional manner, for example, from pixel data that is selectively supplied in synchronism with the raster scan of one or more electron beams over the display area. The display area may be completely identified by the coordinates of points everywhere within the area over the range of values referenced, for example, from upper left corner (0,0) to lower right corner (200,200). Each such point is the location of a pixel which is activated along a scan line of pixels within a sequence of pixels per scan line, and scan lines per frame of the display, all in conventional manner. Background objects, therefore, may be conveniently stored in a Read-Only-Memory (ROM) or Random-Access-Memory (RAM) at address locations that correspond to coordinates, or to pixel counts, on the display area. Thus, the pixels that display the tree 11 and the rock 9 are accessed from memory in the proper sequence to produce the raster-type display of the scene of FIG. 1 in conventional manner.

In accordance with the preferred embodiment of the present invention, an avoidance profile, or path 13, including a plurality of points or nodes 15 is located about the rock 9 (and about other impassable objects 11) at a slight spacing therefrom to represent a path or locus of points that designate varying trajectories about the impassable object. Specifically, as illustrated in the list of FIG. 2, the coordinates of each point 15, 16, in the path are listed in a memory look-up table to define the incremental trajectories from point to point around the impassable object 9. Thus, for a displayed movable object (such as a person or vehicle or the like) positioned at a beginning point (point A), an operator may elect to move the object to be displayed at a selectable point (point C). This may be accomplished in conventional manner using a "mouse"-type controller which controls the movement of a display cursor to the point C that can then be designated as the next position for the movable object by "clicking" the "mouse"-type controller on the point. Thereafter, displayable icons suitable for characterizing a displayed person, for example, in a walking or running stride are successively recalled from ROM or RAM and are interposed on the stream of pixel data for the displayed background per frame at different intervals per successive frame in a conventional manner in order to display the movable object as moving along the trajectory or direct path 12 between points A and C.

However, in accordance with the preferred embodiment of the present invention, the trajectory 12 between points A and C is compared with look-up tables of coordinate data for points along all avoidance paths 13, 17 around all impassable objects in the displayed background for the purpose of determining whether any virtual intersections will occur between the direct trajectory 12 and the locus of points or nodes 15 that form an avoidance path.

Figure 4B:
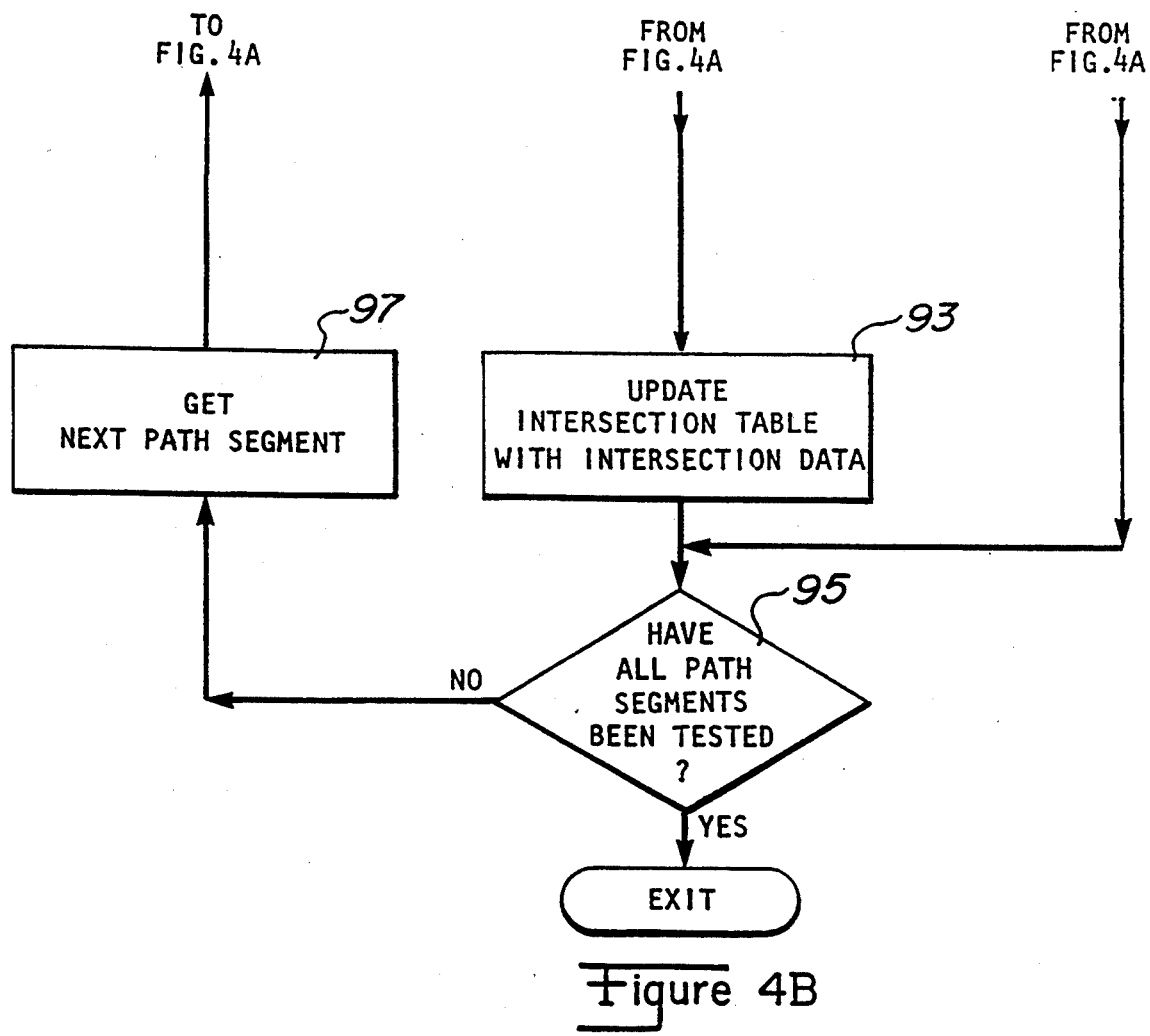
FIGS. 4, 4A and 4B are a flow chart of the process for determining whether there is an intersection between the direct trajectory and the avoidance paths.
Figure 4:
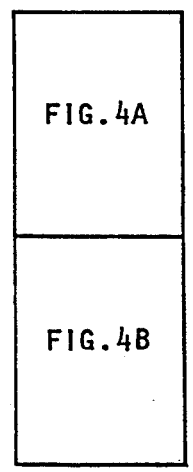
Figure 4A:
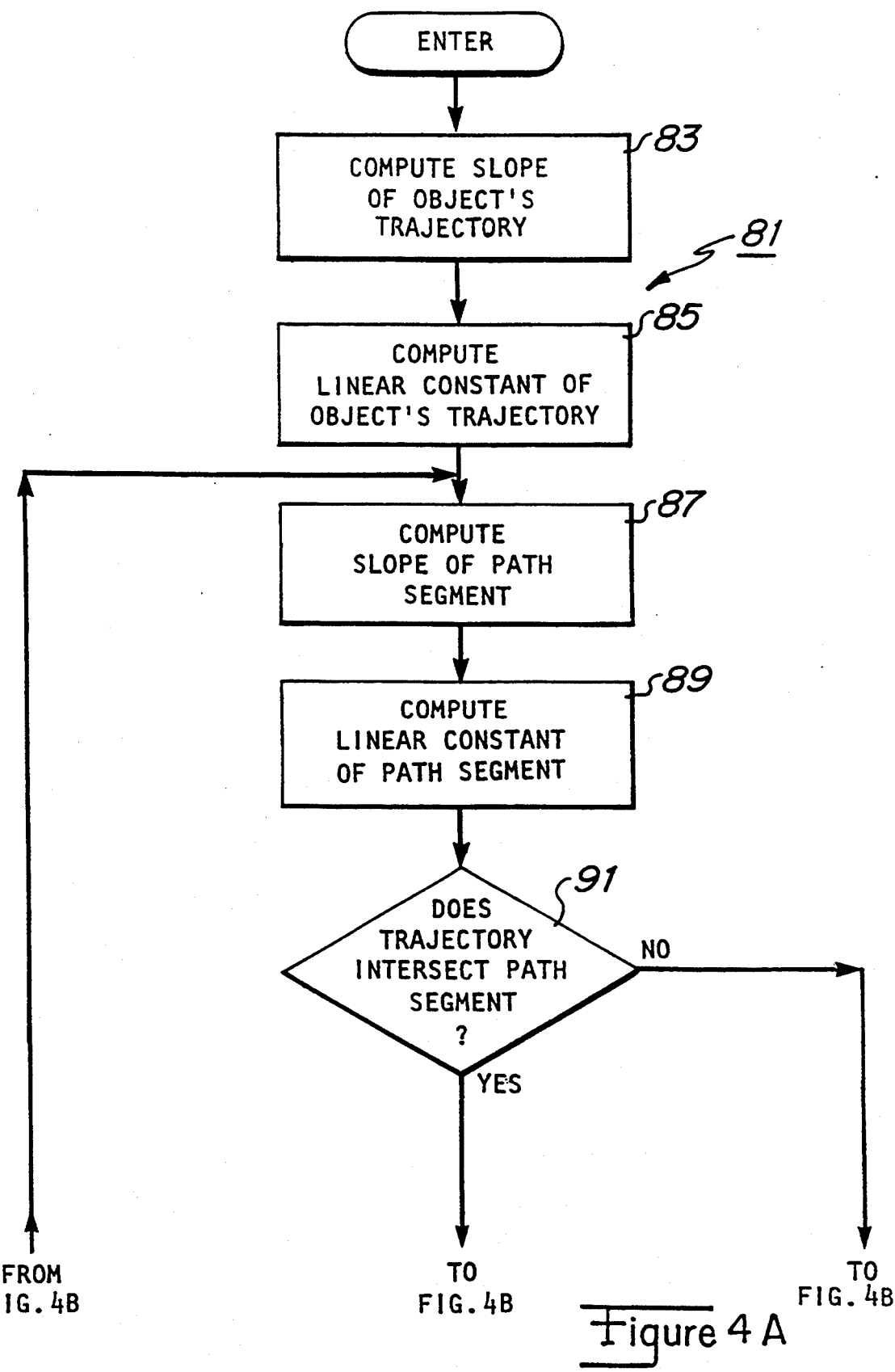

In particular, a flow chart 81, as illustrated in FIG. 4, delineates the steps in the process of comparing the trajectory 12 for virtual intersections with the avoidance paths 13, 17. The process of determining intersections begins with the computation of the slope and the linear constant of the direct trajectory 12 in steps 83 and 85 respectively. Next, the slope and linear constant for a path segment between nodes 15 that form the avoidance path 13, 17 are computed in steps 87 and 89 respectively. A determination of whether there is an intersection between the direct trajectory 12 and the path segment is then made in step 91. If an intersection is detected in step 93 then the coordinate data for the intersection is noted in an intersection table and a determination of whether all path segments between the nodes 15 of the avoidance paths 13, 17 have been examined is made in step 95. If no intersection is found in step 91, then the process proceeds directly to the determination of whether all path segments have been examined in step 95 without updating the intersection table. If there are path segments that have not been compared to the direct trajectory 12, then the next path segment is obtained in step 99 and the process returns to step 87. Otherwise, a determination that all paths have been examined indicates the completion of comparing for virtual intersections.

Where such intersection is determined to occur then the displayed path along which the movable object will travel from point A toward point C will be modified in any one of several ways, as follows. For example, movement may proceed along the direct trajectory 12 from point A until the intersection of the direct trajectory 12 with a point 15 (or the interpolated trajectory between two adjacent points 15, 16), after which the movable object is displayed as following the incremental trajectories between successive points or nodes 15 along the avoidance path 13. Alternatively, the determination of an intersection between the direct trajectory 12 and the avoidance path 13 initiates recalculation of the initial trajectory from point A along a path 19 toward the nearest point 16 on the avoidance path, or for interpolated intersections, along a path 21 toward the end point 15 of the incremental trajectory 15-16 that is closest to the selectable or target point C. The recalculation is preferably performed using a modified Bresenham algorithm for non-unit steps. Thus, the object is moved along the trajectory that the Bresenham algorithm specifies for getting the object from the current position to the intersection or node where the path will be accessed. Thereafter, the movable object is displayed in successive locations along the incremental trajectories of the avoidance path 13 around an impassable object 9.

The displayed movement of a movable object along the avoidance path 13 continues to a position at or near an intersection of the direct trajectory 12 with a point, or with an incremental trajectory between adjacent points 23, 25 along the avoidance path 13. The movable object may then be displayed as leaving the avoidance path 13 at a point 23 which is nearest to the selectable point C to travel along the trajectory of path 27. Alternatively, the movable object may be displayed along a trajectory 29 as leaving the avoidance path 13 at the nearest end point 25 defining an incremental trajectory 25-23 which intersects with the direct trajectory 12. Of course, the movable object may also be displayed as traversing the direct trajectory 12 between point A and the interpolated intercept (or intercept at a point) of the avoidance path 13, along the avoidance path 13 to the interpolated intercept (or intercept at a point) with the direct trajectory 12, and then along the direct trajectory 12 to the target point C. Thus, the movable object is displayed as traversing a path around an impassable object along a line of travel that closely resembles the natural or "intelligent" choices that a live entity which is depicted by the displayed moving object would make.

In more complex background situations, the path of travel of the displayed movable object, for example, from point A to point B (within a confined area of movement) may require analysis of each exit trajectory (from the avoidance path) to determine whether other impassable objects will be encountered. Thus, exiting the avoidance path 13 from the nearest of end points 31 that define an increment of avoidance-path trajectory which intercepts the direct trajectory 14 between points A and B may encounter an impassable object 33, requiring another avoidance-path correction around object 33. Such an avoidance path correction occurs the same as the correction of travel between point A and B defined above. However, such recorrection merely redefines the beginning point (point A) to be the nearest of end points 31. Thus, the exit from the avoidance path may be from the intercept of the incremental trajectory along the avoidance path with the direct trajectory 14 to traverse a path that does not intersect an impassable object 33.

The preferred embodiment of the present invention, also provides "intelligent" movement of an object that can pass in either direction around an impassable object. As illustrated in FIG. 1, a displayed tree 11 includes an avoidance path 17 completely around the base. Thus, displayed movement of an object from point D to the target point E may intersect the avoidance path 17 that could be traversed in either direction. Such avoidance path 17 is formed as the locus of points that are completely identified in a look-up table of coordinate data points similar to the coordinate data points illustrated in FIG. 2. Thus, the distances between sets of adjacent points can be accumulated between intercept points 35, 37 in each direction around a closed set of data points, and the shortest of the accumulated distances determines the direction of movement around the impassable object.

Figure 3:
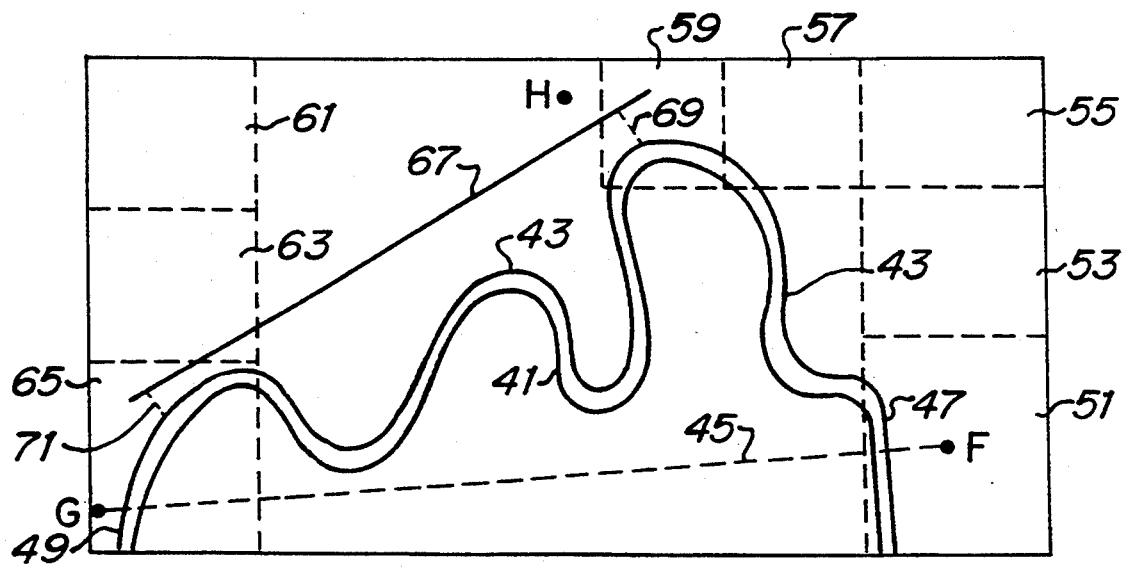
FIG. 3 is a pictorial representation of a computer-controlled raster-type display of another background scene in a video game, including freeway paths between spaced sectors.

While FIGS. 1 and 3 illustrate the display as showing top plan views of the movement from one position on the screen to another, it should be understood that the method of the present invention may also be used where the display shows a perspective view. For example, if the rock 9 and tree 11 were displayed in perspective view, an object may still be moved from point D to E. However, as the object moves along the path of nodes closest to the top of the display about the tree, the object would not be shown on the display (i.e., the display would be seen as if the object was actually moving behind the tree.

Referring now to FIG. 3, there is shown a pictorial representation of raster-type display of a background scene (for example, of a waterfront shoreline) including a meandering impassable object or boundary 41. The impassable object or boundary 41 includes an avoidance path 43 along, and in close proximity with, the boundary 41. Thus, displayed movement of a movable object from point F to point G would normally occur along the direct trajectory 45, to the intercept 47 with the avoidance path 43, and along such avoidance path 43 to the intercept with the direct trajectory 45, and then along the direct trajectory 45, to the target point G in the manner previously described. This would result in unintelligent meandering movement along the boundary 41 in place of expected, "intelligent" movement in more direct line toward the target point G.

In accordance with a second embodiment of the present invention, the display area is segmented into several sectors 51, 53, . . . 65 (for data analysis, but not for display of any sector boundary lines). In selected sectors of the display area, there are provided one or more auxiliary avoidance or "freeway" path(s) 67 which traverse the major spacings between remote sectors of the display. Therefore, the coordinate data associated with the display position of a movable object is analyzed to determine whether or not the position is in a sector that includes a freeway that traverses the display in a direction generally toward the target point G.

Thus, in the illustration of FIG. 3, a movable object displayed at point F that is to be moved to point G would be moved in the manner previously described along trajectory 45 to intersection 47 and then along the avoidance path 43 through various sectors of the displays. However, the coordinate data at points along the avoidance path 43 is analyzed for sector identification, and whether that sector includes a freeway 67 generally aligned in the proper direction toward the target point G. Thus, the coordinate data along path 43 and residing in sectors 51 and 57 would not initiate transition to the freeway 67. For example, if movement was from point F toward point H, analysis of the coordinate data would indicate no benefit to be derived from traversing along the freeway 67 that resides within sector 59. However, coordinate data along avoidance path 43 that resides in sector 59 can be analyzed for "intelligent" use of an available freeway 67. For movement toward point G, the analysis of the coordinate data for points along the meandering avoidance path 43 would indicate greater distance therealong than along freeway 67 to the sector 65 in which the freeway 67 and the point G reside. Therefore, a movable object is displayed as traversing direct trajectory 45 from point F to intercept 47, then along avoidance path 43 into sector 59 at which a transition occurs to freeway 67 along the shortest path 69 between the two paths 43, 67 within the sector, then along the freeway 67 into sector 65 at which a transition occurs along the shortest path 71 between the two paths 43, 67, to the intercept 49 and then along trajectory 45 to point G. Of course, the freeway(s) 67 need not be straight, but only substantially shorter between remote sectors than a traversing avoidance path between such remote sectors. In this manner, the movable object is displayed as having traveled along a route of natural or intelligent selection between points F and G without further control or intervention by an operator.

Figure 5:
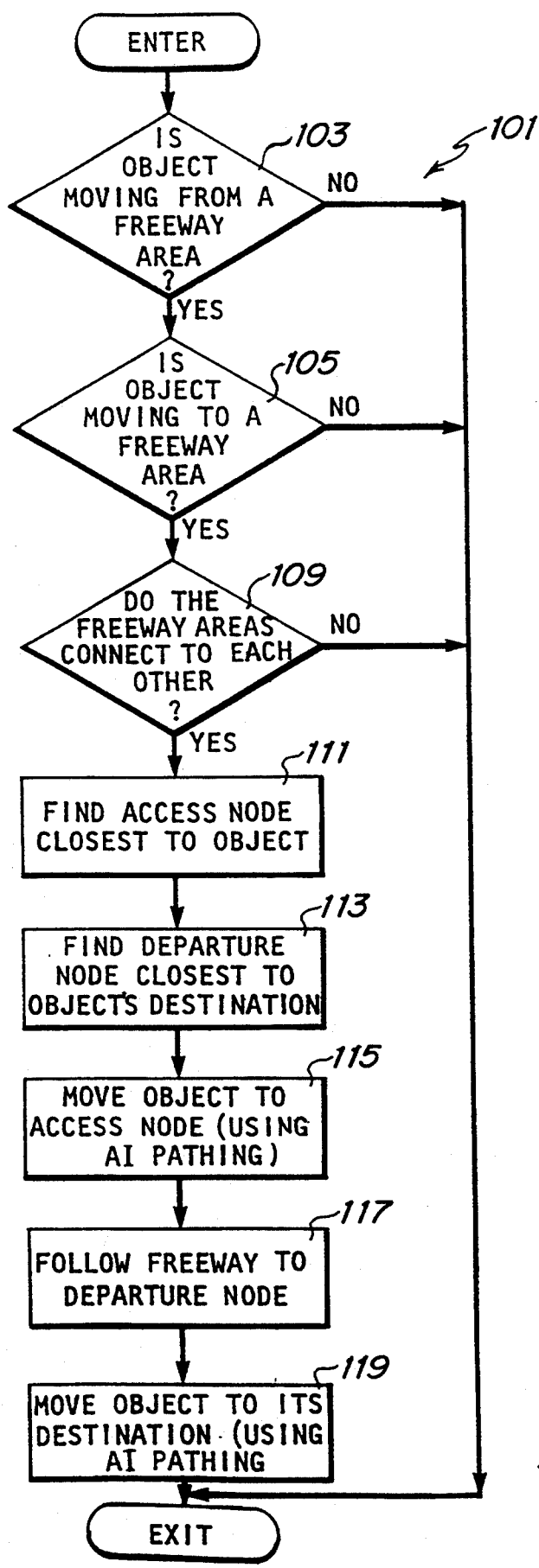
FIG. 5 is a flow chart of the process for establishing a freeway path.

A flow chart 101 for the process of analyzing whether a freeway path is available, and moving the object along the established path of points is illustrated in FIG. 5. Once the object has been placed on an avoidance path 43, a determination of whether a freeway path 67 exists in the direction of the object's selectable position (Point 6) is made. A first step 103 is analyzing whether the object is moving from a freeway area. In a preferred embodiment, this step 103 is accomplished by determining whether any freeway path exists in the sector in which the object is positioned. For example, this determination may be made at each node along the avoidance path upon which the object is traversing. If there is no freeway path in the sector, the process is complete and the object continues to follow the avoidance path. If there is a freeway path in the sector, a next step 105 determines whether the object is moving to a freeway area. Preferably, this step evaluates whether either the selectable position or the intersection point on the avoidance path is positioned in a sector that includes a freeway path. Again, if there is no freeway path in the sector for the destination, the process is complete. Otherwise, a next step 109 in the process determines whether a freeway connects the sector in which the object is positioned and the sector in which the destination of the object lies. If no freeway connects the object's present position and the object's destination, then the process is complete, no freeway is utilized, and the object is moved with a normal pathing. If there is a freeway path connecting the current sector of the object, the object is moved towards its destination. The process continues with a step 111 of finding an access node along the freeway path that is closest to the position of the object. Next, a step 113 of finding the node along the freeway path closest to the objects destination or selectable position is executed. The object is then moved from its present position to the access node in step 115. The freeway path is followed to the departure node in step 117. Finally, the object is moved from the departure node to the destination in step 119. While the process has been described as moving the object along a path from node to node, it should be understood that the movement involves establishing a locus of points between the nodes for each movement of the object therebetween.

Figure 6A:
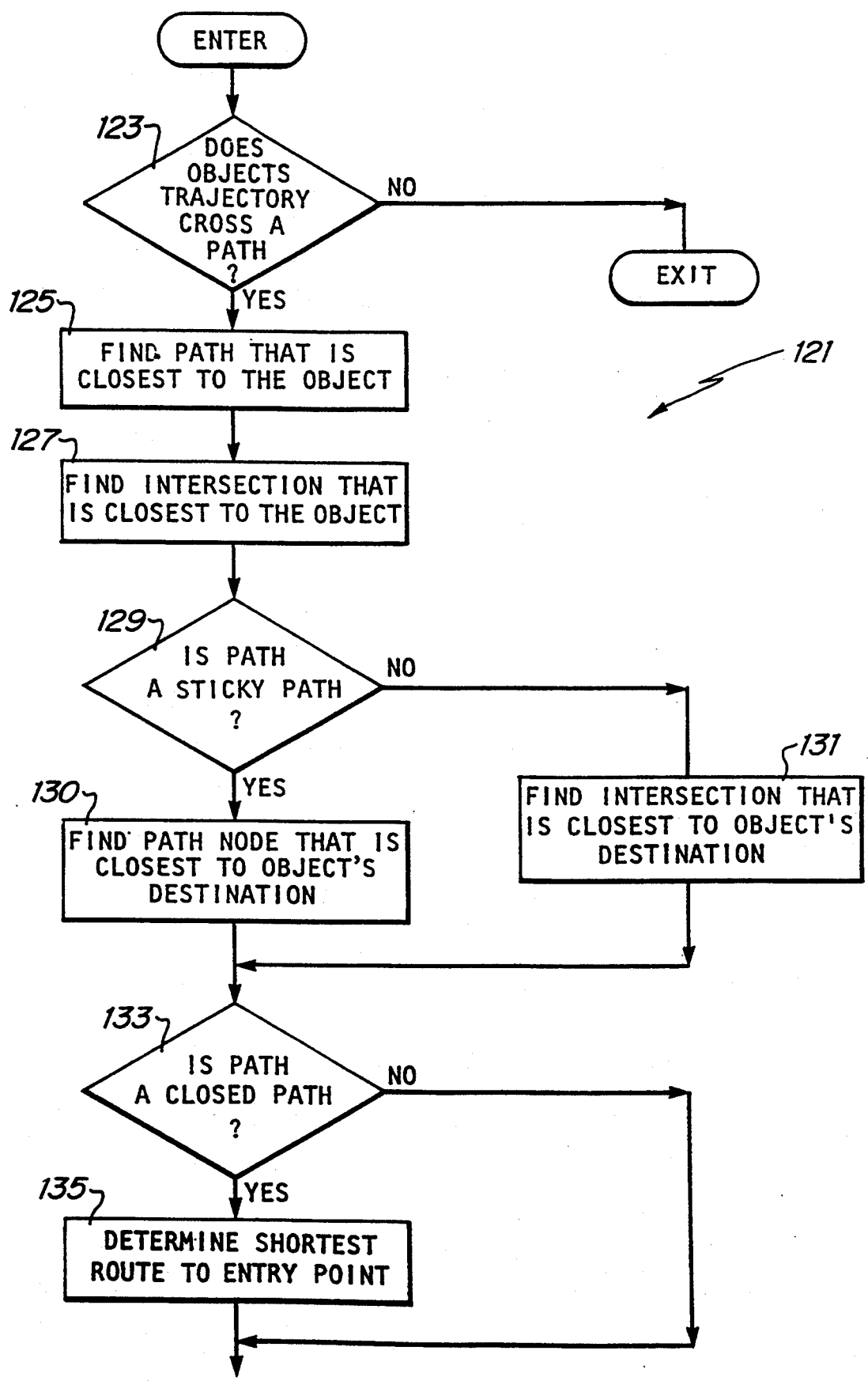
Figure 6B:
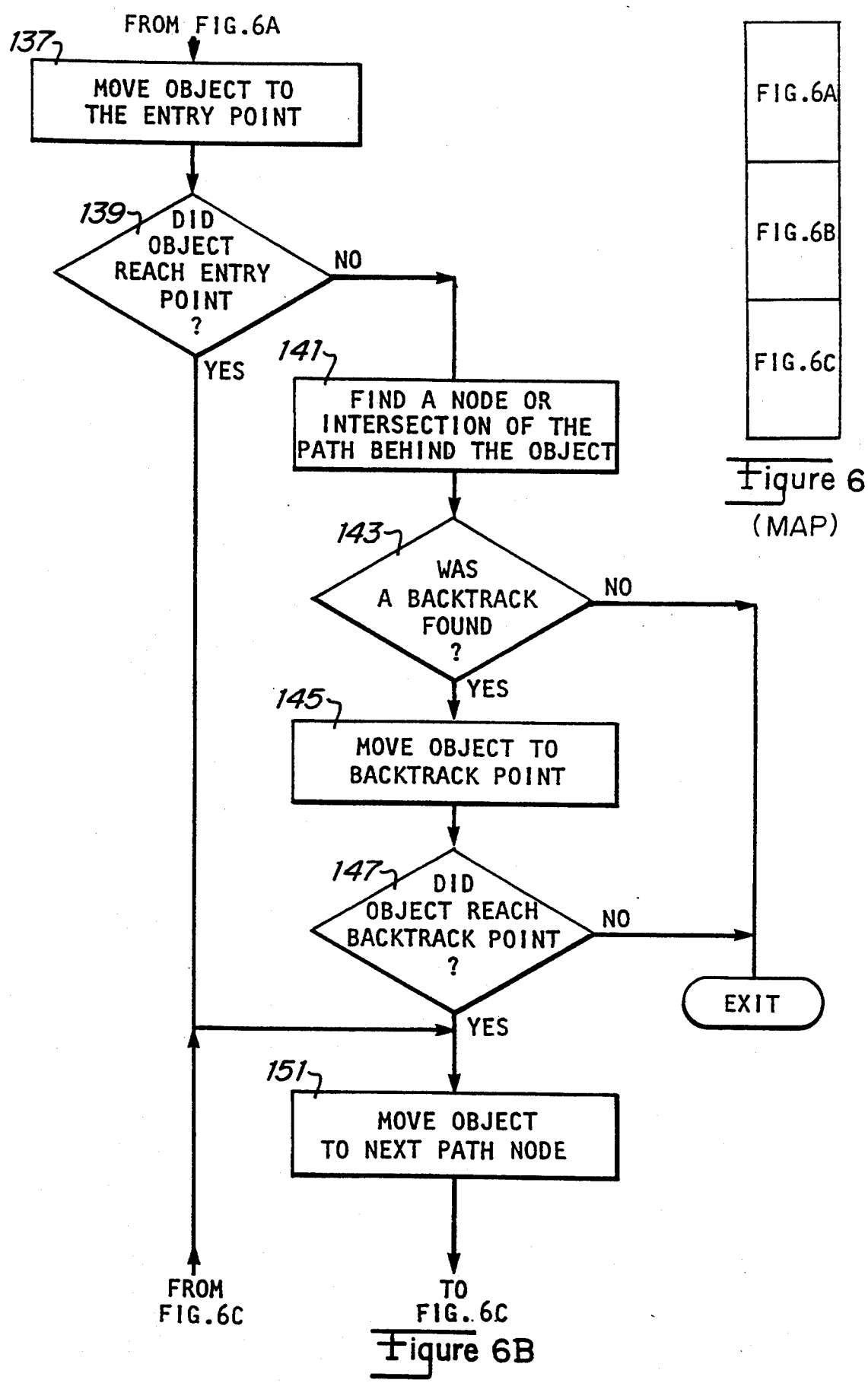
Figure 6C:
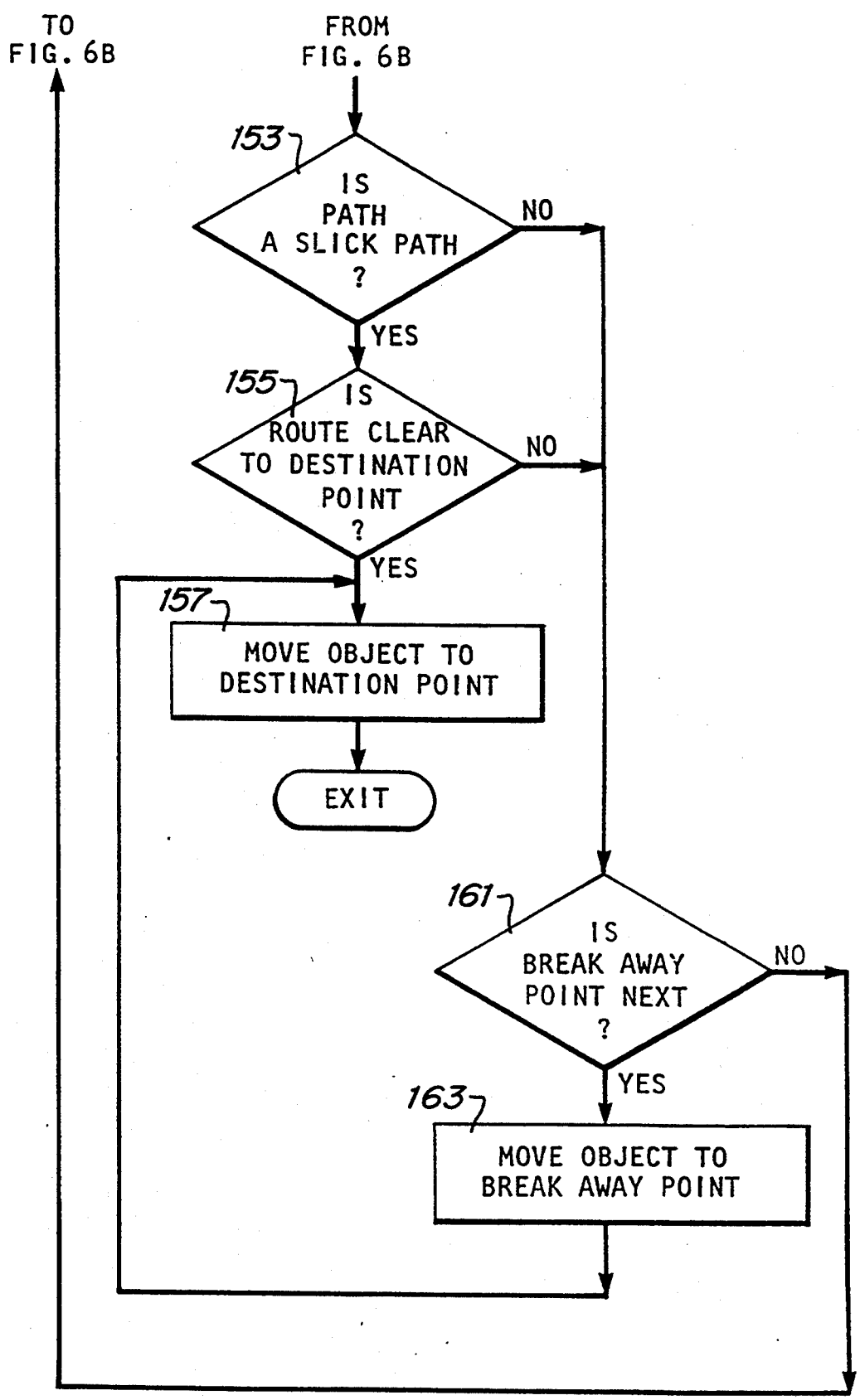

If no freeway path is available then the object is moved from point A to point B using normal pathing. Referring now to FIG. 6, there is shown a flow chart 121 of the normal pathing process by which coordinate data for the points on the display and along avoidance paths are analyzed to produce displays of "intelligent" movement around impassable objects or areas without intervention of the operator. A first step 123 in analyzing the coordinate data to produce "intelligent" movement along the display is to determine whether there are any intersections between the object's direct trajectory and any avoidance paths 13, 17 and 43 on the display. The existence of any intersections can be accomplished as described above with reference to FIG. 4. If no intersections are found then the direct trajectory may be followed to the selectable position and the analysis is complete. However, if intersections are found to exist, then a step 125 of finding the avoidance path that is closest to the objected is performed. Additionally, in step 127 the intersection closest to the position of the object is located.

Next, the process determines whether the path found to be closest is a "sticky path". A sticky path is one that holds the object on the path until the object reaches the node of the path that is closest to the object's destination point and then releases the object to continue to its destination. If the path is "sticky," then the node closest to the object's destination is located in a next step 130. If, on the other hand, the path is not "sticky" then the next step 131 locates the intersection closest to the objects destination.

After the completion of either step 130 or step 131, the next step 133 is to check whether the path is closed. If the path is closed then the route from entry in the avoidance path to exit from the avoidance path having the shortest distance is identified and selected in step 135. Since each avoidance path is formed by a series of nodes, the distance along alternate routes in a closed avoidance path can be easily calculated by summing the distances between adjacent points along each alternate route. If the path is not closed then it is unnecessary to calculate the route having the shortest distance since there is only a single route.

Once the route has been selected, the object is moved to the entry point (step 137). In a following decision step 139, the process checks whether the object reached the entry point. If the entry point was reached, then the process continues to step 151 where the object is moved to the next node along the path. However, if the entry point was not reached then the process attempts to get on the avoidance path at a point near the entry point in series of steps 141, 143, 145 and 147. In these steps, the process attempts to "backtrack" along a trajectory in a direction 180° from the object's previous trajectory. If a path is found on the backtrack trajectory, then the closest of the intersection and the node on the path will be accessed. This allows an object that is blocked from moving along the trajectory at its current position to move backward away from the blocking area onto a path around it. The process begins by searching for a backtrack point or intersection on the path behind the object in step 141. If the backtrack point was not found the process is complete and unsuccessful. If a backtrack point was found, the object is moved to the backtrack point in step 145. The process then tests whether the backtrack point was reached (step 147). If the backtrack point cannot be reached, the process is complete and unsuccessful as if no backtrack point had been found. If the backtrack point is found, the process continues using the backtrack point in place of the entry point and proceeds to step 151 where the object is moved to the next path node.

Once the object has been moved to the next path node, additional inquiries about the object's path are made. In step 153, the process checks whether the path is "slick." A "slick" path is one that allows the object to exit from the node and proceed directly to the selectable position if there is a route that does not encounter any additional impassable objects. Thus, if the path discovered to be "slick" in step 153 then there is further evaluation of whether there is a clear route (i.e., a route that does not intersect with any avoidance paths) to the selectable point. If a clear path exists, the object is moved to the selectable position in step 157 and the process is complete having moved the object from the beginning position to the selectable position. If it is determined that the path is not slick or there is no clear route to the destination then the process inquires whether the next node is the exit node (an object may also exit at a non-node which is the point where the object's trajectory last intersects the path between two adjacent nodes. That intersection or "break away" point will be used if the path is not "sticky."). If the next node is not the exit node, the process returns to step 151 and moves the next node. However, if the next node is an exit node then the object is moved to the exit node in step 163 and then the process proceeds to step 157 where the object is moved to the destination.

Figure 7:
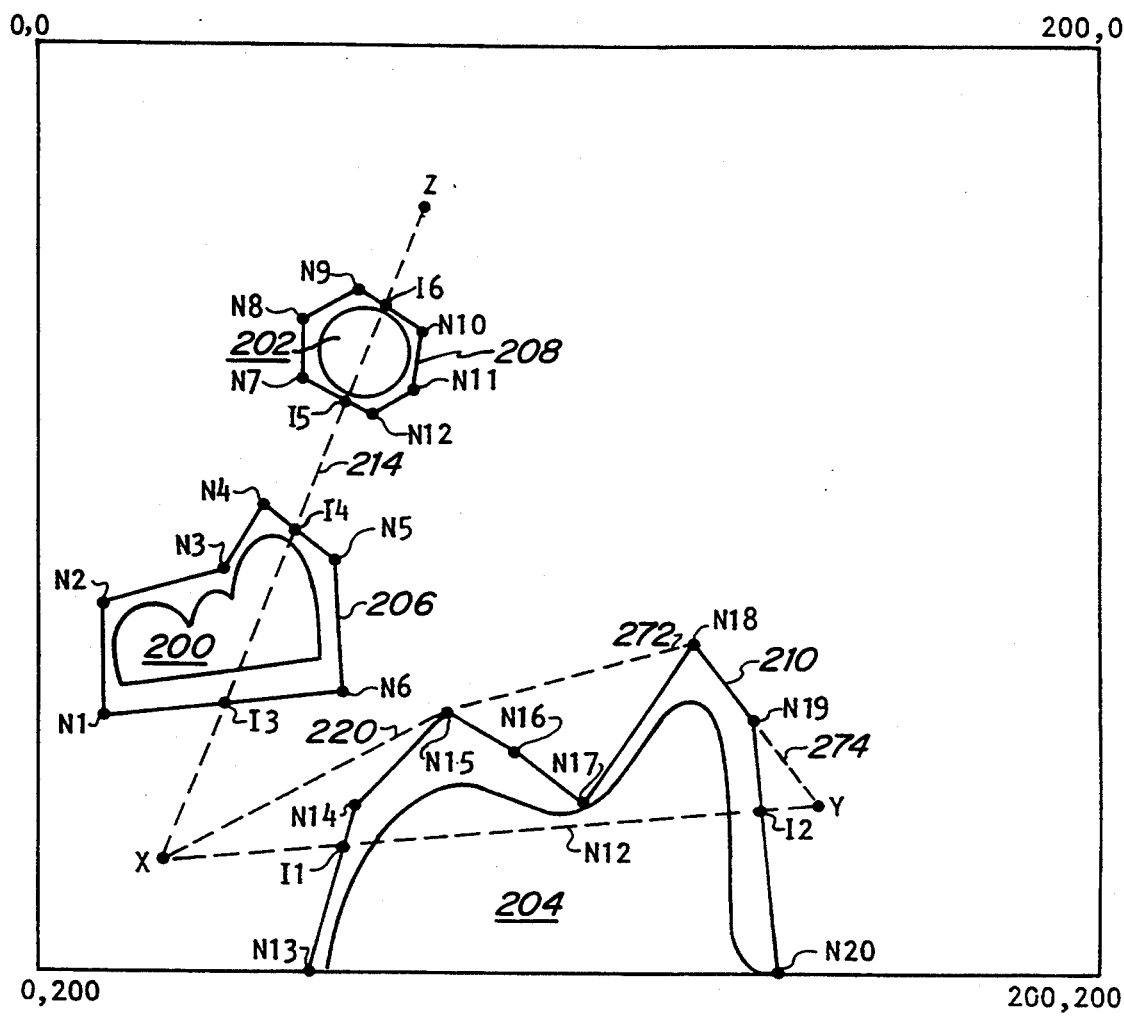
FIG. 7 is a pictorial representation of a computer controlled raster-type display of a third background scene in a video game for the third embodiment of the present invention.

Refering now to FIGS. 7-10, the third embodiment of the present invention will be discussed. In a third embodiment, the present invention advantageously provides an alternate method for "intelligent" movement about any impassable objects. In FIG. 7, a raster type display shows a background including impassable objects such as a rock 200, a tree 202 and a mountain 204. As with the display of FIG. 1, the display area is identified by coordinates of points everywhere over the area of the display from (0,0) in the upper left corner to (200,200) in the lower right corner. The movement of an movable object, similar to the object described above with reference to the first embodiment, from a beginning position to a selectable position may be specified by an operator using either a mouse as described above, direction keys or a joystick. The third embodiment of the present invention advantageously provides intelligent movement of the object from beginning position to the selectable position with a method comprising the steps of: defining a polygon about each impassable object; calculating a direct trajectory between the beginning position and the selectable position; determining whether the direct trajectory intersects any of the impassable objects on the display; sorting the intersections according to their closeness to the beginning position; constructing a path from the beginning position, around the impassable objects intersected, to the selectable position; and optimizing the path. In addition, if more than one impassable object is intersected by the direct trajectory, further optimization is performed by selecting the path with the shortest distance from the possible paths about the impassable objects intersected.

In accordance with the third embodiment of present invention, a polygon 206, 208, 210 is defined about each of the impassable objects 200, 202, 204, respectively. Each polygon is defined by a plurality of nodes or points N1–N20. The nodes N1–N6 define the polygon 206 about the rock 200. Similarly, the nodes N7–N12 and nodes N13–N20 respectively define the polygons 208, 210 about the other impassable objects 202, 204. The polygons 206, 208, 210 are preferably closed, not self-intersecting (e.g. Jordan polygons) and do not intersect any other polygons about impassable objects. The use of nodes is advantageous because the polygons are automatically defined simply by specifying nodes that define the boundary of the impassable object. The nodes allow the polygons to be to conceptualized by programers defining polygons. It should be understood that while the polygons 206, 208 and 210 are illustrated in FIG. 7 for ease of understanding, the polygons 206, 208, 210 are provided for data analysis only and are not typically shown on the display. In particular, the nodes N1–N20 are preferably stored in memory and as lists of points, with each polygon specified by a pointer to a first node in a chain of lists.

The present invention advantageously allows the polygons to be defined as one of three possible types. First, a totally accessible polygon is one in which polygons may be entered and exited as if they are not an obstacle to movement of the object, but at the same time represent obstacles when the desired trajectory does not begin or end within the polygon. Second, polygons may be near point accessible which means entry to and exit is allowed, but only from the point along the polygon nearest to the start or end point of the trajectory that lies on the polygon. Finally, polygons may be barred access polygons which cannot be entered. The various types of polygons provide the method of the present invention with versatility for the programers using the present method. The process of defining the polygons will now be described in more detail with reference to a flow chart 216 shown in FIG. 8A. The polygons 206, 208, 210 are defined in a step 218. The polygons are each defined by a pointer to a list of nodes. A list of polygons is then created by listing the pointers to the first node of each polygon. The polygons preferably defined by orienting the nodes about each polygon in a clockwise manner; if not the direction is reversed. Such orientation simplifies the calculation of an alternate path about the polygon by determining the interior of the polygon given two nodes. Next, step 220 determines whether the beginning point is in a polygon. If the beginning point is in a polygon, then the beginning point is redefined according to the type of polygon in which the beginning point is positioned, in step 222. For example, if the type is a near access polygon then the beginning point becomes the nearest point on the polygon to original beginning point. The line segment from the polygon to the original beginning point will be added once the path has been determined. If the type of the polygon is totally accessible then the polygon will be removed from the polygon list. A similar evaluation and redefinition occurs in steps 224 and 226 with respect to the selectable point.

After the polygons 206, 208, 210 have been defined, the direct trajectory between the beginning point and the selectable point is computed in step 228. This is preferably accomplished by calculating the line segment between the beginning point and the selectable point. For example, a pair of direct trajectories 212, 214 are shown in FIG. 7 between X and Y, and X and Z.

Once the direct trajectory 212, 214 between the beginning position and selectable position has been determined, the direct trajectories 212, 214 are compared to the polygons 206, 208, 210 to determine whether the direct trajectories 212, 214 intersect the polygons 206, 208, 210 defined by the nodes N1–N20. The direct trajectories 212, 214 are preferably compared to the polygons 206, 208, 210 by determining whether the line segment representing the direct trajectory 212, 214 intersects any of the vectors between adjacent nodes in the polygons 206, 208, 210. As shown in FIG. 7, such a comparison of the direct trajectory 212 between X and Y returns intersections I1, I2 on polygon 204 between nodes N13 and N14, and N19 and N20, respectively. The comparison of the direct trajectory 214 between X and Z with the polygons 206, 208, 210 results in four intersections: I3 between nodes N1 and N6, I4 between nodes N4 and N5, I5 between nodes N7 and N12, and I6 between nodes N9 and N10.

The method of the present invention next establishes paths around the intersected polygons 206, 208, 210 and selects the path with the shortest distance. For movement of an object from X to Y, one path around the polygon 210 would be from I1 to I2 through nodes N14, N15, N16, N17, N18, and N19. The other path around the polygon 210 would be through nodes N13 and N20. The distance of the path is determined by summing the distances between the adjacent nodes in the path from I1 to I2. The path having the shortest distance is then selected for movement of the object from the beginning position to the selectable position. Where the trajectory between the beginning position and the selectable position intersects more than one polygon as with the direct trajectory 214, the shortest path is determined about each polygon individually. For the direct trajectory 214 between X and Z, a shortest path for polygon 206 between I3 and I4 is calculated separately from the shortest path about polygon 208 between I5 and I6. For example, the shortest path for polygon 206 is the path through nodes N5 and N6 and the shortest path about the polygon 208 is through nodes N7, N8, N9.

The distance between two particular nodes is preferably definable by the user. This is particularly advantageous where the polygon borders on the edge of the display such as with polygon 210. Since all impassable objects are defined by closed polygons regardless of their position, impassable objects which lie on the edge of the display will be defined by a polygon that has one side along the edge of the display. Even though the polygon has a side along the edge of the display, this side is not a clear path for movement about the impassable object and movement of the object along the side is not permitted. Thus, defining the distance between two nodes to be infinity or the maximum possible value will insure that the object always moves along the path that shown on the display rather than the path along the edge of the display. For example, the distance between nodes N13 and N20 is preferably defined to be the maximum possible value to insure that any trajectory that intersects polygon 210 takes a path about the mountains 204 on the portion of the screen displayed rather than along the edge of the display where the object is not permitted to travel and where the object would not be fully viewable. Therefore, in determining which is the shortest path about the polygon 210 between the intersections I1 and I2, the path through nodes N14, N15, N16, N17, N18 and N19 would be selected.

Figure 8A:
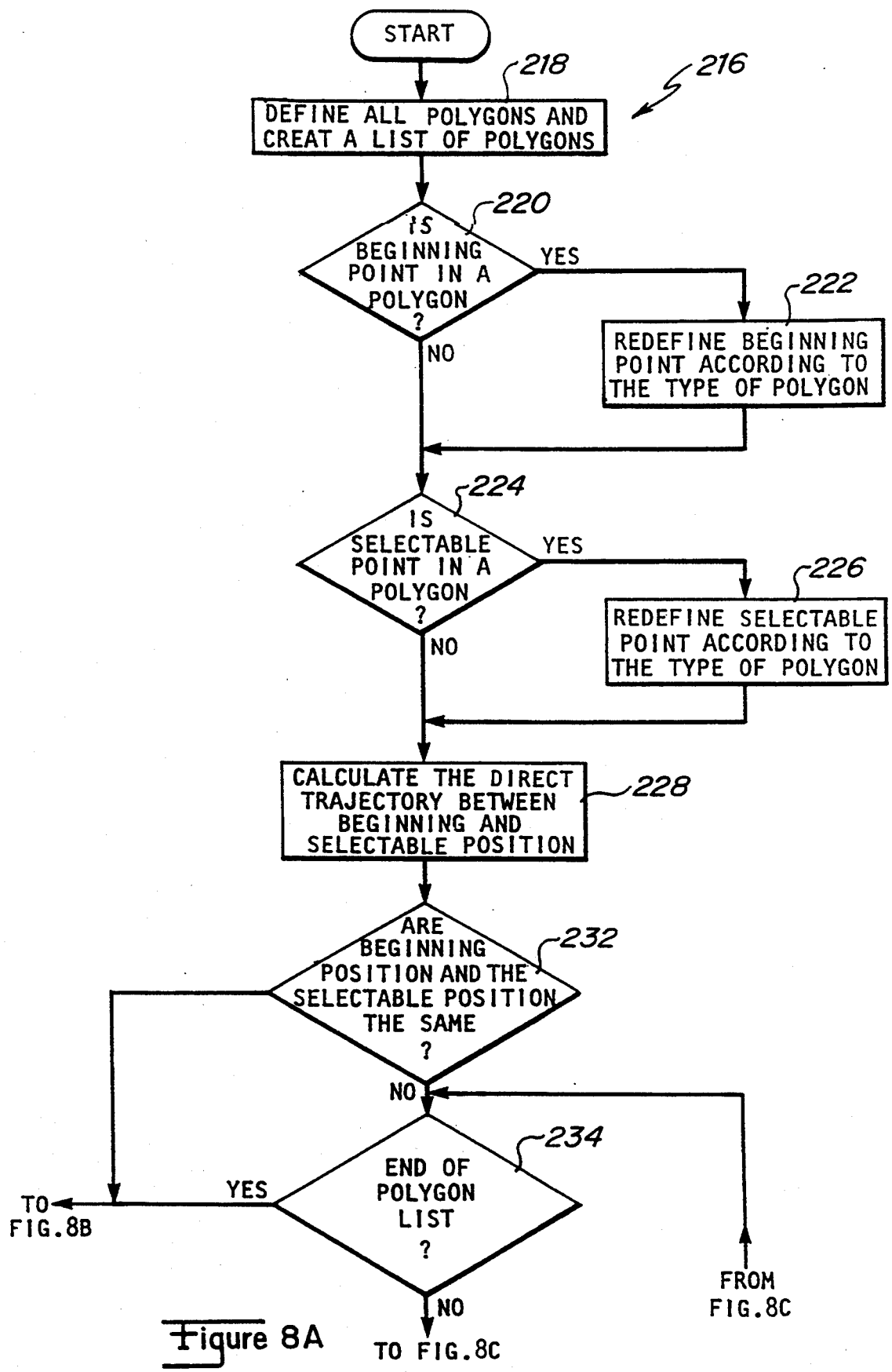
Figure 8B:
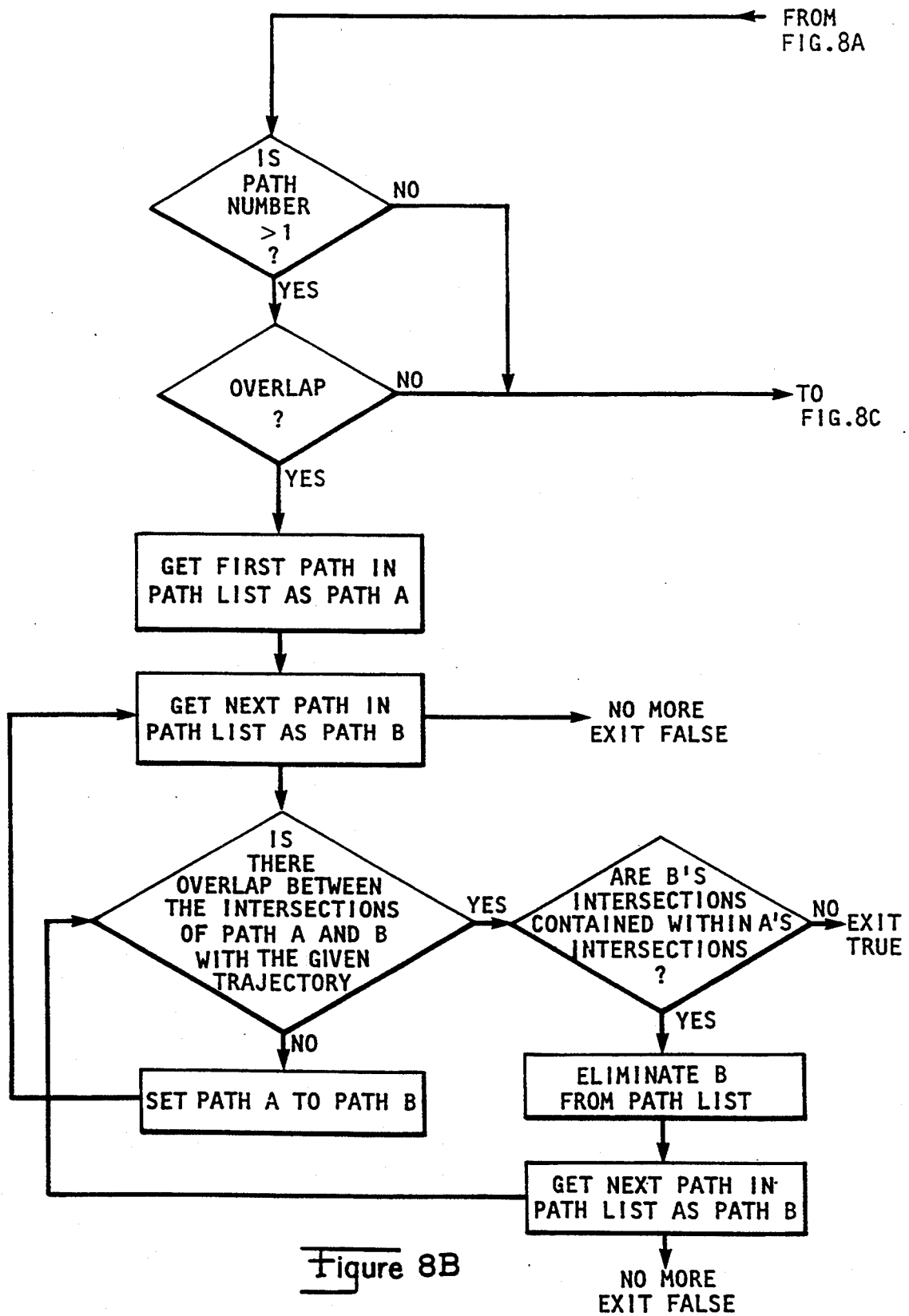

The third embodiment preferably determines whether the direct trajectory intersects with any polygons as well as the shortest path according the process shown in a flowchart 230 of FIG. 8B. In step 232, the method tests whether the beginning position and the selectable position are the same. If they are the same, no comparisons are necessary and the method continues to the next series of steps. If the beginning position and the selectable position are not the same, the process determines if the end of the polygon list has been reached, in step 234. If the end of the list has been reach, either no polygons are in the display field, or all the polygons in the display field have already been compared to the direct trajectory. Otherwise, the direct trajectory is compared to the polygon noted in the list of polygons in step 136. If there is no intersection, step 238 gets the next polygon in the list and loops through the comparison step 236 so that the direct trajectory is compared to each polygon in the list. However, if the direct trajectory intersects the polygon, the intersection closest to the beginning point, and the . intersection closest to the selectable point are determined in step 240. The shortest path between these two intersection points is then calculated in step 242, and the shortest path is stored in a PATHLIST in step 244. The paths stored in the PATHLIST are stored according to the distance from the beginning position to the closest intersection. Once the PATHLIST of shortest paths about polygons has been formed and the intersection nearest to the beginning position and intersection nearest the selectable position for each polygon is saved, the intersection points are analyzed to determine if any of the polygons entry and exit the intersections overlap any of the other polygons entry and exit points. By "overlap" it is meant the when viewed along the trajectory from the beginning position, no intersection saved for a polygon lies between the intersections saved for any other polygon. In step 246, a variable (pathnumber) which indicates the number of paths in PATHLIST, or the number of polygons intersected is incremented and the process continues by getting the next polygon in the list in step 238 and returning to step 234.

If no overlap was found, a path between the beginning position and the selectable position is created by linking the shortest paths, the beginning position and the selectable position together. For example, a path from X to Y around the intersected polygon 210 would include nodes X, I1, N14, N15, N16, N17, N18, N19, I2 and Y. A path from X to Z around the intersected polygons 206, 208 would include nodes X, I3, N6, N5, I4, I5, N7, N8, N9, I6 and Z. It should be understood that since the trajectory 214 intersects more than a single polygon, the path is created by forming a path along nodes starting with the beginning point, X, then proceeding to the closest intersection to X, namely I3. The intersection I3 and the shortest path from I3 to I4 about the polygon 206 are then linked to X. The next closest intersection I5 to the beginning point is then retrieved and linked to intersection I4. The path associated with intersection i5, the shortest path about the polygon 208 through nodes N7, N8, N9 and I6, is also appended to the path. It should be understood that this process could continue for any number of polygons that are intersected by a direct trajectory. After the intersection closest to the selectable position is linked to the path, the path is competed with by adding the node for the selectable position such as Z.

Figure 8C:
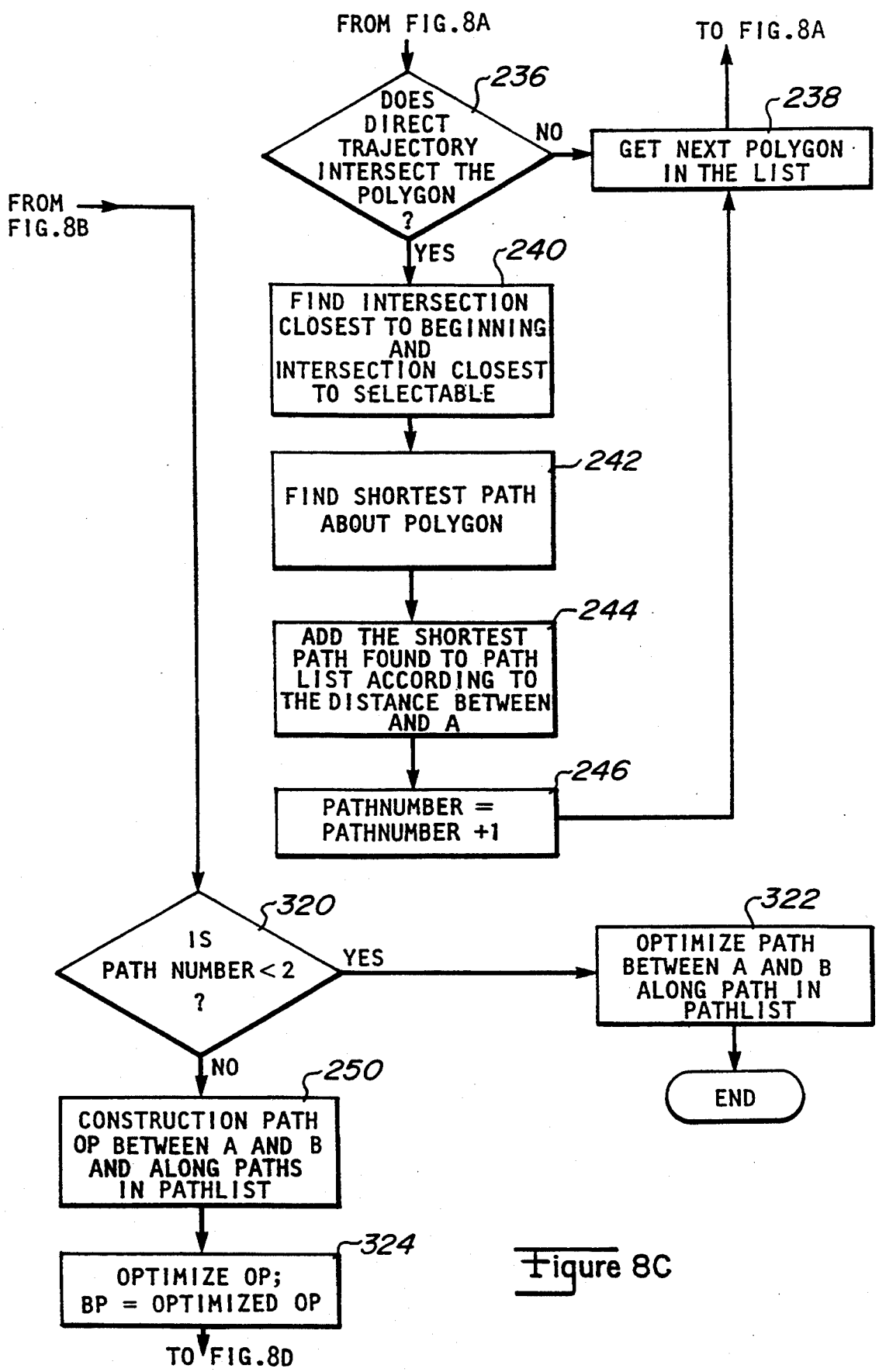
Figure 9:
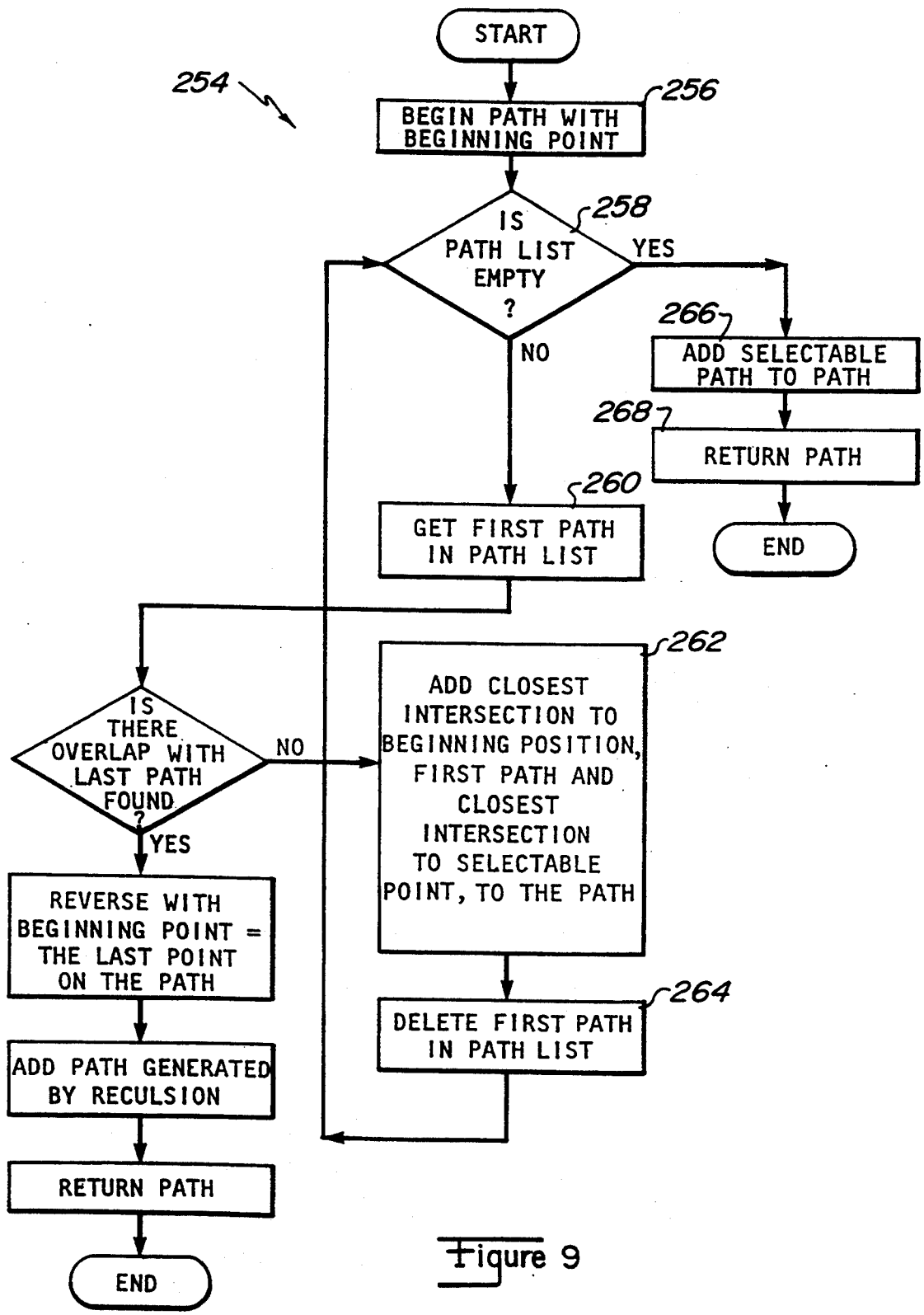
FIG. 9 is a flow chart of the process in the third embodiment of the present invention for constructing a path between the two prints from list of paths about polygons.

The process of constructing the path is a step 250 in a flow chart 252 of FIG. 8C for the avoidance pathing process, and will be detailed more specifically with reference to a flowchart 254 of FIG. 9. The process begins forming the path with the beginning point in step 256. In step 258, the process tests whether the PATHLIST is empty which indicates that no polygons are intersected, or the paths about the intersected polygons have already been added to the path. If the PATHLIST is not empty, then the first path in the list is retrieved in step 260. If there is no overlap between this polygon's entry and the previous polygon's exit then the retrieved path is added to the path by inserting the nodes representing the closest intersection to the beginning point, the shortest path and the closest intersection to the selectable point, in that order. Once these nodes have been inserted, the first path in the PATHLIST is deleted in step 264 and the process returns to step 258. If there was overlap detected during the analysis of the entry and exit intersection points of the polygons, then one of two alternatives is taken at each overlap. If the entry and exit point of a polygon lies between the entry and exit point of another then this polygon is not used in creating the a path from the beginning position to the selectable position. If the entry point of some polygon (polygon B) is between the entry and exit point of another polygon (polygon A) and the exit point of polygon B does not lie between the entry and exit point of polygon A then the path created will continue to exit point of polygon A and at that point the path is saved and a new path is generated by the method described herein with the beginning point being the exit point of polygon A and the same selectable point. (this is a recursion of the method generating the unoptimized path in that the method is calling itself. The two paths are then combined into one path). Thus, the process will cycle through all the paths in the PATHLIST and add them to the path being constructed between the beginning and selectable positions until PATHLIST is empty. Then the selectable position added and the entire path is returned in steps 266 and 268. However, if overlap is detected the program will call itself to generate the path starting at the exit point of the previous polygon to the selectable point. Then the path returned is appended to the current path (after removing the duplicate point generated, the exit from the previous polygon) and this path is returned.

As best shown in FIG. 7, once a path that avoids impassable objects between X and Y has been established, the path it is optimized. In other words, any nodes on the original path that can be eliminated are removed to create an optimized path between the beginning position and the selectable position. The optimized path does not intersect with any of the polygons and has a shorter distance than the original path. For example the path between X and Y is initially established along the points X, I1, N14, N15, N16, N17, N18, N19, I2, and Y. After one iteration of the optimization process, the path between X and Y is reduced to the path comprising the nodes X, I1, N14, N15, N16, N17, N18, N19, I2, and Y. The first iteration of optimization removes nodes I1, and N14, by replacing them with a direct path 220 between X and N15. Similarly, a second iteration of optimization eliminates nodes N16 and N17 by providing a direct path 272 between N15 and N18. The path is fully optimized after a third iteration of the optimization process which eliminates I2 from the path.

Figure 10A:
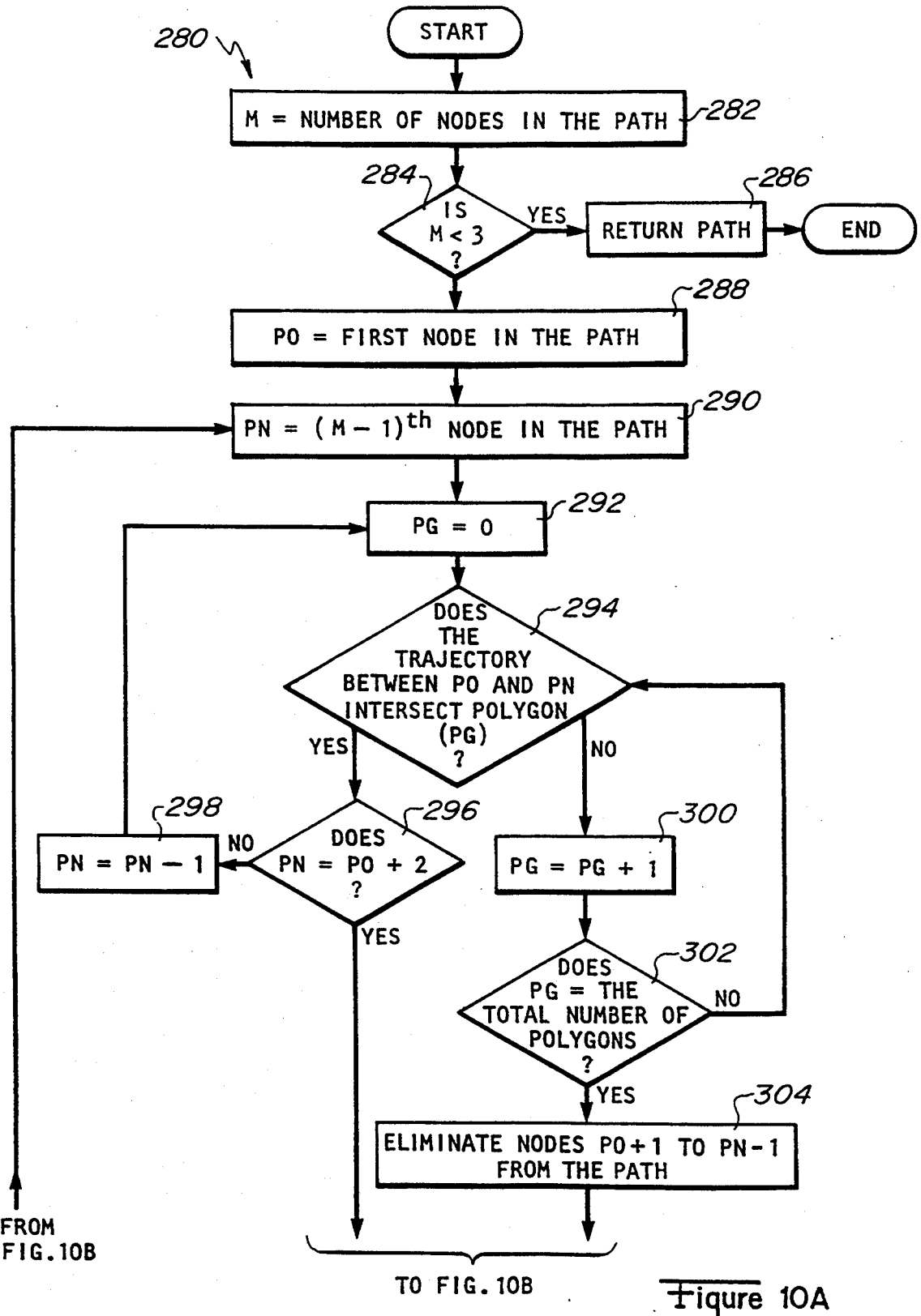

Refering now to FIG. 10, the optimization process will be described with particularity. A flow chart 280 illustrates the process for optimizing a path. The process begins by setting a variable M equal to the number of nodes in step 282. In step 284, the value of M is compared to three. If M is less than three, then there are only two nodes in the path and there is nothing to optimize so the path is returned in step 286 and optimization is complete. On the other hand, if M is three or greater the process to continues to steps 288 and 290 where an index PO is set to the first node in the path, and an index PN is set to the (M-1)th node in the path, respectively. In step 292, the polygon list is initialized to the beginning of the list by setting PG equal to zero. Step 294 determines whether the trajectory between nodes PO and PN intersect the polygon(PG). If an intersection is found there is not an optimizing path between nodes PO and PN. In step 296 the process checks to see if node PN is within two nodes of node PO which may indicate optimization is not possible. If node PN is not within two nodes of node PO, then the index PN is decremented in step 298 and the next node closer to node PO is evaluated to determine whether a direct path between node PO and node PN-1 exists by looping to step 292. If no intersection is found between the polygon and the trajectory between nodes PO and PN in step 294, then the direct trajectory between nodes PO and PN is compared to the remaining polygons by the loop provided by steps 300 and 302. If the direct trajectory between nodes PO and PN is found not to intersect any of the polygons then there is an optimizing path between nodes PO and PN. The nodes between nodes PO and PN are eliminated from the path in step 304 and the M is reset to the number of nodes in the optimized path in step 306. Finally, in step 308, PO is compared with M-2. If M-2 is greater than PO, further optimization is possible. PO is incremented in step 312 and the process is performed again with the new value of PO. If M-2 is not greater than PO, the path has been fully optimized and the optimized path is returned in step 310.

The third embodiment of the present invention also provides additional optimization where the path between the beginning position and the selectable position intersects more than one polygon. In such situations, as with the path between X and Z, the additional optimization calculates the optimal distance for all possible combinations of routes about the intersected polygons 206, 208 and selects the shortest. For example, the pathing would provide an optimized path from X to Z using the shortest distances about each polygon 206, 208. The optimized path is an optimization of the path through the nodes I3, N6, N5, I4, I5, N7, N8, N9, and I6. However, the additional optimization calculates the distance along three other paths between X and Z, namely: a path in opposite directions about the both polygons 206, 208 through nodes I3, N1, N2, N3, N4, I4, I5, N12, N11, N10, and I6; a path opposite in direction only about the first polygon 206 through nodes I3, N1, N2, N3, N4, I4, I5, N7, N8, N9, and I6; and a path opposite in direction only about the second polygon 208 through the nodes I3, N6, N5, I4, I5, N12, N11, N10, and I6. Therefore, such additional optimization would return the shortest path that avoids the polygons 206 and 208, namely, the path defined by the nodes X, N6, N11, N10 and Z. The fully optimized result is a path along the shortest path about the first polygon 206 and longer path about the second polygon 208.

Figure 8D:
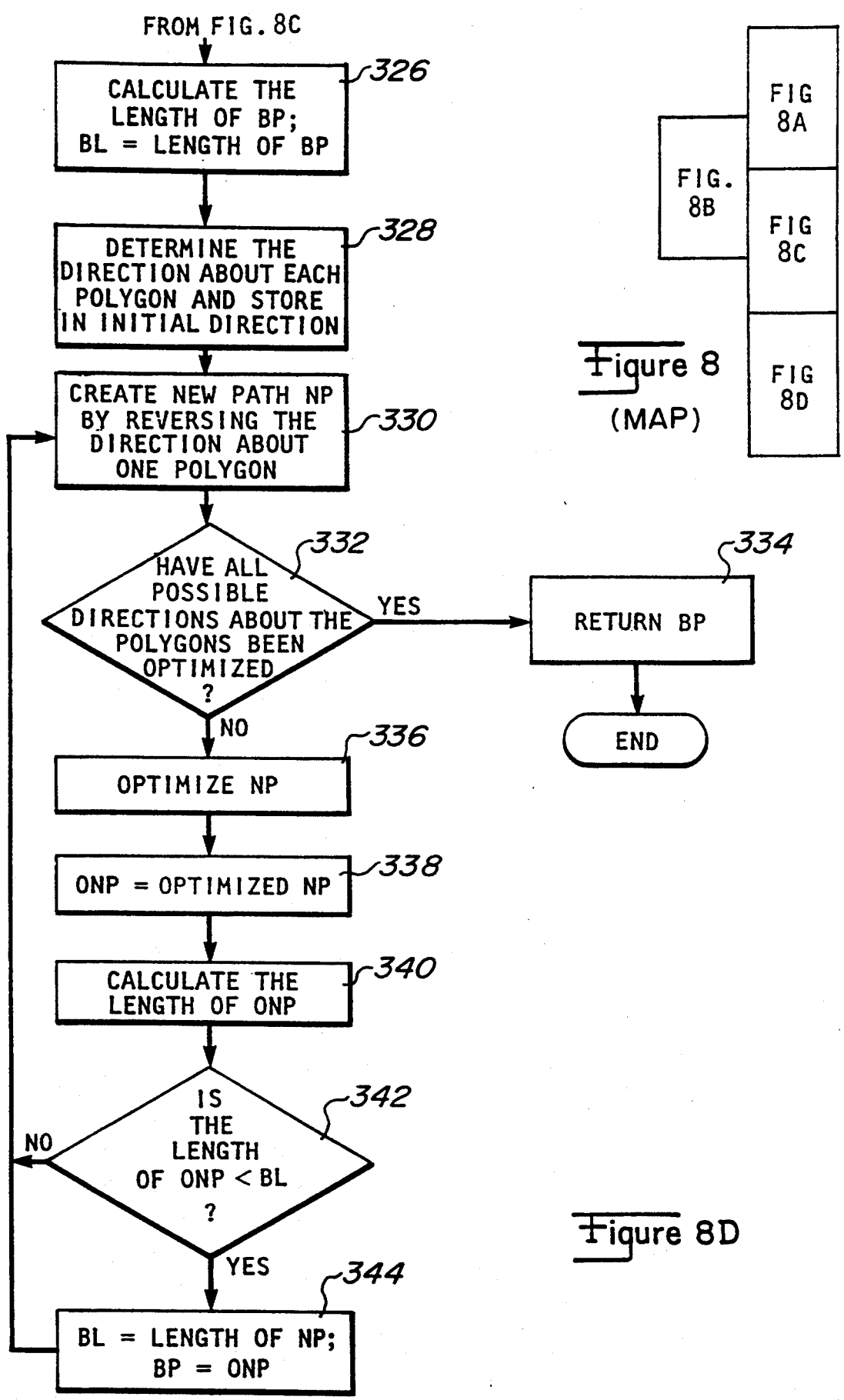

The process for providing additional optimization is illustrated in the flowchart 252 shown in FIGS. 8C and 8D. First, the process compares the variable pathnumber to two, in step 320. If the pathnumber is less than two, one or fewer polygons are intersected by the trajectory between the beginning and selectable positions. Thus, normal optimization as discussed above with reference to FIG. 10, is performed in step 322 and will fully optimize the path. If the pathnumber is two or greater then the path OP between the beginning and selectable positions is constructed in step 250. This construction step 250 is preferably in accordance with the method described in FIG. 9. In step 324, the path OP is optimized using the same method as in step 320. The optimized path is also stored as path BP. In step 326, the length of the path BP is calculated and a variable BL is set equal to the length of the path BP. Next, in step 328, all the possible paths about each polygon and the possible combinations of those paths are determined. The initial direction is set to the direction about which the path BP traverses the polygons. Those skilled in the art will understand that the permutation of possible paths about n polygons will be $2^n$. Thus, for a path that intersects two polygons there are $2^2$ or four different paths from the beginning position to the selectable position and about the polygons. The method of the present invention advantageously calculates each of the $2^n$ path and selects the path with the shortest optimized distance. In step 328, a new path NP is created by changing the direction about which one of the intersected polygons is traversed. A determination of whether all possible paths about the intersected polygons is made in step 332. If all the possible directions have been examined, then the process returns the path BP in step 334 and the additional optimization is complete. However, if not all the directions have been examined the path NP is optimized in step 336 similar to the optimization in steps 322 and 324. The steps 338, 340, 342, and 344 define a loop that effectively optimizes all the possible paths about the intersected polygons and saves the shortest path in the path BP. In particular, step 338 sets the path ONP equal to the optimized path of NP. In step 340, the length of the path ONP is calculated. In step 342, the length of ONP is compared to the shortest length found, BL. If the length is less than BL, BL is set to be the length of ONP and the path BP is set to be ONP and the process loops to step 330. Finally, it should be noted that in the third embodiment the entire path from the beginning position to the selectable position is determined before any movement of the object along the path. Thus, the animation provided by movement in the third embodiment is very smooth and uniform because delays due to processor speed limitation and calculation the path during movement are eliminated. Therefore, the preferred embodiments provide intelligent movement from the beginning position to the selectable position in an automatic fashion.

WHAT IS CLAIMED IS:

1. A method for establishing a contiguous path of points between a beginning position and a selectable position for moving a movable object on a computer-controlled display showing at least one continually stationary impassable object, said path, positions and objects defined by Cartesian coordinates, said method comprising the steps of:

providing coordinates for the beginning position and the selectable position;

defining a position of at least one impassable object having a perimeter of line segments;

calculating a direct trajectory between the beginning position and the selectable position;

comparing the direct trajectory to the position defined for each impassable object;

establishing a locus of points intermediate the beginning position and the selectable position, said locus of points positioned between the beginning position and a line segment of an impassable object where the direct trajectory does not have a same position as the position of each of the impassable objects and positioned about the impassable object where the direct trajectory and the impassable objects have the same position and, moving the movable object from the beginning position along the locus of points to the selectable position after the locus of points is established.

2. The method of claim 1, wherein said step of defining a position of at least one impassable object further comprises the steps of:

selecting a plurality of nodes about the impassable object, each node having coordinates; and calculating an incremental trajectory between the coordinates of each node, each incremental trajectory defining one of the line segments of the perimeter of the impassable object.

3. The method of claim 2, wherein said step of comparing the direct trajectory to the position of the impassable objects comprises determining whether the direct trajectory intersects an avoidance path for each impassable object.

4. The method of claim 3, wherein said step of establishing a locus of points intermediate the beginning position and the selectable position further comprises the steps of:

forming a path of points along the direct trajectory until the selectable position or an intersection between the direct trajectory and an avoidance path is reached;

forming the path of points along the avoidance path until another intersection between the direct trajectory and the avoidance path is reached; and returning to forming the path of points in accordance with the first forming step.

5. The method of claim 4, further comprising the steps of:

determining the paths of points about the impassable object;

analyzing whether there is more than one path of points about the impassable object and calculating the distance along each path of points; and selecting the path of points about the impassable object that has a shorter distance.

6. The method of claim 1, wherein said step of defining a position of at least one impassable object comprises defining a polygon having line segments about each impassable object, where each of said polygons are continuously stationary, closed, and not self-intersecting any other polygon about other impassable objects.

7. The method of claim 6, wherein the step of comparing the direct trajectory to the position defined for each impassable object further comprises determining whether the direct trajectory intersects the polygon for each impassable object.

8. A method for establishing a contiguous path of movement for moving a movable object between a beginning position and a selectable position on a computer-controlled display showing at least one continually stationary impassable object, said path, positions and objects defined by Cartesian coordinates, said method comprising the steps of:

providing coordinates for the beginning position and the selectable position;

defining an avoidance path of a series of line segments having coordinates about each impassable object;

calculating a direct trajectory between the beginning position and the selectable position;

comparing the direct trajectory to the avoidance paths for intersections therebetween and for each avoidance path determining a closest intersection and a farthest intersection from the beginning position; and establishing a locus of points intermediate the beginning position and the selectable position, said locus of points including at least:
  a) a first set of points including the beginning point and points forming a trajectory to an attachment point along the line segment containing the closest intersection;
  b) a second set of points including the avoidance path from the attachment point to a detachment point along the line segment containing the farthest intersection;
  c) a third set of 5 points including the detachment point and points forming a trajectory toward the selectable position; and moving the movable object from the beginning position along the locus of points to the selectable position after the locus of points is established.

9. The method of claim 8, wherein the attachment point is the closest intersection.

10. The method of claim 8, wherein the attachment point is the node of the avoidance path that is closest to the beginning position and is an endpoint of the incremental trajectory containing the closest intersection.

11. The method of claim 8, wherein the attachment point is the node of the avoidance path that is closest to the selectable position and is an endpoint of the incremental trajectory containing the farthest intersection.

12. The method of claim 8, wherein the detachment point is the farthest intersection.

13. The method of claim 8, wherein the detachment point is the node closest to the selectable position.

14. The method of claim 8, wherein the detachment point is the first node that is an endpoint of an incremental trajectory that intersects with the direct trajectory and is between the selectable position and the first set of points.

15. The method of claim 8, wherein the step of proceeding along the avoidance path further comprises the steps of:

determining whether the avoidance path is closed;

calculating the distance from the closest intersection to the farthest intersection along each path of the avoidance path; and if the avoidance path if closed selecting the path from the closest intersection to the farthest intersection having a shortest distance.

16. A method for establishing a contiguous path of movement between a beginning position and a selectable position for moving a movable object on a computer-controlled display showing at least one continually stationary impassable object, said path, positions and objects defined by Cartesian coordinates, said method comprising the steps of:

1) providing coordinates for the beginning position and the selectable position;
2) defining a polygon about each impassable object, where each of said polygon is closed, not self-intersecting and not intersecting any other polygon;
3) comparing a direct trajectory between the beginning position and the selectable position to each polygon for intersections therebetween and for each polygon determining a first intersection closest to the beginning position and a second intersection closest to the selectable position;
4) establishing a locus of points intermediate the beginning position and the selectable position by:
  a) forming a first path of points from the beginning position along the direct trajectory until the selectable position or an intersection between the direct trajectory and a current polygon is reached;
  b) forming a second path of points along the current polygon until another intersection between the direct trajectory and the current polygon is reached;
  c) connecting the first and second paths of points to the beginning position;
  d) testing for overlap of the current polygon with one or more other polygons by comparing an entry and an exit point of the current polygon with a last exit point of an other polygon to determine whether the last exit point of an other polygon lies between the entry and exit points of the current polygon when traversing the direct trajectory from the beginning point to the selectable point;
  e) excluding any polygon from the path of points if the last exit point of the polygon lies at or before the exit point of the current polygon; and
  f) performing the steps (1) through (4) recursively using an exit point from the current polygon as the beginning position to produce a recursive path around all polygons and;
  g) moving the object from the beginning position to the selectable position along the locus of points after the locus of points is established.

17. The method of claim 16 wherein the step of forming a path of points along the current polygon until another intersection between the direct trajectory and the current polygon is reached further comprises the step of selecting the next intersection of the direct trajectory and the current polygon.

18. The method of claim 16 wherein the step of forming a path of points along the current polygon until another intersection between the direct trajectory and the current polygon is reached further comprises the step of selecting the last intersection of the direct trajectory and the current polygon.

* * * * *